United States Patent
Hwang

(10) Patent No.: US 9,853,609 B2
(45) Date of Patent: Dec. 26, 2017

(54) SEMICONDUCTOR APPARATUS AND RECEIVER THEREOF

(71) Applicant: SK hynix Inc., Icheon-si Gyeonggi-do (KR)

(72) Inventor: Jin Ha Hwang, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/927,894

(22) Filed: Oct. 30, 2015

(65) Prior Publication Data

US 2017/0063311 A1 Mar. 2, 2017

(30) Foreign Application Priority Data

Aug. 26, 2015 (KR) .................. 10-2015-0120308

(51) Int. Cl.
| | |
|---|---|
| *G11C 7/10* | (2006.01) |
| *H03F 1/32* | (2006.01) |
| *H03F 1/02* | (2006.01) |
| *H03F 1/22* | (2006.01) |
| *H03F 3/195* | (2006.01) |
| *H03F 3/30* | (2006.01) |
| *H03F 3/45* | (2006.01) |
| *H03F 3/72* | (2006.01) |

(52) U.S. Cl.
CPC ......... *H03F 1/3205* (2013.01); *H03F 1/0277* (2013.01); *H03F 1/223* (2013.01); *H03F 3/195* (2013.01); *H03F 3/301* (2013.01); *H03F 3/45183* (2013.01); *H03F 3/72* (2013.01); *G11C 7/109* (2013.01); *G11C 7/1048* (2013.01); *G11C 7/1084* (2013.01); *G11C 7/1093* (2013.01); *H03F 2200/27* (2013.01); *H03F 2200/294* (2013.01); *H03F 2200/321* (2013.01); *H03F 2200/408* (2013.01); *H03F 2203/45466* (2013.01); *H03F 2203/45702* (2013.01); *H03F 2203/7206* (2013.01); *H03F 2203/7236* (2013.01)

(58) Field of Classification Search
CPC ..... G11C 7/1048; G11C 7/1084; G11C 7/109; G11C 7/1093
USPC ............... 455/114.3, 230, 296, 311, 312; 365/189.17, 230.06
See application file for complete search history.

(56) References Cited

U.S. PATENT DOCUMENTS

| | | | | |
|---|---|---|---|---|
| 4,303,895 A | * | 12/1981 | Ohnishi | ............ H04L 25/03133 333/18 |
| 5,036,525 A | * | 7/1991 | Wong | ................. H04L 25/063 333/18 |
| 6,321,282 B1 | * | 11/2001 | Horowitz | ............ G06F 13/4072 326/30 |

(Continued)

FOREIGN PATENT DOCUMENTS

| | | |
|---|---|---|
| KR | 1020010073457 A | 8/2001 |
| KR | 1020050064897 A | 6/2005 |

*Primary Examiner* — Duc M Nguyen
(74) *Attorney, Agent, or Firm* — William Park & Associates Ltd.

(57) ABSTRACT

A semiconductor apparatus includes a receiver configured to generate an output signal by amplifying an input signal received through a channel, and compensate distortion of the input signal based on a control signal preset according to a voltage level of the input signal, and an internal circuit configured to operate in response to the output signal.

16 Claims, 5 Drawing Sheets

(56) References Cited

U.S. PATENT DOCUMENTS

| | | | |
|---|---|---|---|
| 2003/0048858 A1* | 3/2003 | Gazsi | H03M 1/185 |
| | | | 375/316 |
| 2005/0185710 A1* | 8/2005 | Gai | H03F 3/45183 |
| | | | 375/232 |
| 2006/0092333 A1* | 5/2006 | Kang | G11C 7/1051 |
| | | | 348/699 |
| 2007/0171967 A1* | 7/2007 | Bae | H04L 25/03057 |
| | | | 375/233 |
| 2008/0056344 A1* | 3/2008 | Hidaka | H04L 25/03885 |
| | | | 375/232 |
| 2010/0135100 A1* | 6/2010 | Chiu | G11C 7/1072 |
| | | | 365/233.11 |
| 2012/0063242 A1* | 3/2012 | Kim | G11C 7/1012 |
| | | | 365/189.05 |
| 2013/0049864 A1* | 2/2013 | Ikehata | G11C 7/10 |
| | | | 330/253 |
| 2013/0148447 A1* | 6/2013 | Shaeffer | G11O 5/14 |
| | | | 365/189.17 |
| 2014/0269130 A1* | 9/2014 | Maeng | G11C 7/1084 |
| | | | 365/207 |
| 2015/0055431 A1* | 2/2015 | Lin | G11C 7/02 |
| | | | 365/230.06 |
| 2015/0091624 A1* | 4/2015 | Kwak | G11C 7/1072 |
| | | | 327/158 |
| 2015/0294730 A1* | 10/2015 | Lee | G11C 16/32 |
| | | | 365/185.18 |
| 2015/0309726 A1* | 10/2015 | McCall | G11O 5/147 |
| | | | 710/5 |
| 2015/0358007 A1* | 12/2015 | Diffenderfer | H03K 5/13 |
| | | | 327/241 |

* cited by examiner

SEMICONDUCTOR APPARATUS AND RECEIVER THEREOF

CROSS-REFERENCES TO RELATED APPLICATION

This application claims priority under 35 U.S.C. 119(a) to Korean application No. 10-2015-0120308 filed on Aug. 26, 2015, in the Korean intellectual property Office, which is incorporated herein by reference in its entirety.

BACKGROUND

1. Technical Field

Various embodiments generally relate to a semiconductor integrated circuit, and more particularly to a semiconductor apparatus and a receiver thereof.

2. Related Art

Semiconductor apparatuses such as semiconductor memory apparatuses may perform reading and writing operations by receiving various signals from external chipsets and transmitting signals requested from the external chipsets.

When the semiconductor memory apparatuses receive signals, receiver may hold all incoming information. The receiver may receive an external signal, amplify the received signal, and provide the amplified signal to an internal circuit. For example, the receiver may detect a logic level of the external signal by comparing the external signal with a reference voltage, amplify the signal, and provide the amplified signal to the internal circuit.

The signal strength of the external signal may vary depending on a transmission channel condition and an environment condition with respect to the semiconductor apparatus. Nonetheless, the receiver needs to accurately detect the external signal.

SUMMARY

According to an embodiment, there is provided a semiconductor apparatus. The semiconductor apparatus may include: a receiver configured to generate an output signal by receiving an input signal and amplifying the received input signal, and compensate distortion of the input signal based on a control signal preset according to a level of the input signal; and an internal circuit configured to be operated by receiving the output signal.

According to an embodiment, there is provided a receiver. The receiver may include: an intensity selection unit configured to generate an equalizer driving signal based on a control signal preset according to a level of an input signal; and a buffering unit configured to generate an output signal by receiving the input signal and amplifying the received input signal, and compensate distortion of the input signal based on the equalizer driving signal.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
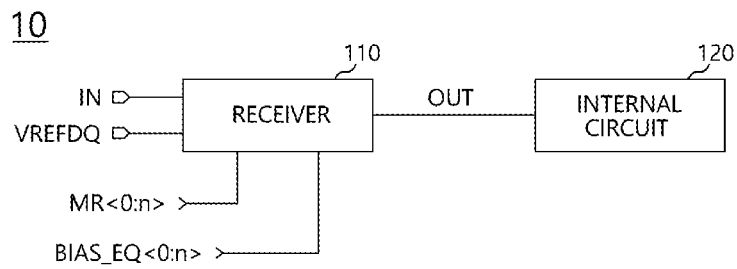
FIG. 1 is a configuration diagram illustrating a semiconductor apparatus according to an embodiment of the inventive concept.

Exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made in these exemplary embodiments without departing from the principles and spirit of the inventive concept.

FIG. 1 is a configuration diagram illustrating a semiconductor apparatus according to an embodiment.

Referring to FIG. 1, a semiconductor apparatus 10 according to an embodiment may include a receiver 110 and an internal circuit 120.

The receiver 110 may receive a small signal as an input signal IN from an external chipset, amplify the input signal IN based on a data reference voltage VREFDQ, and generate the amplified input signal IN as an output signal OUT. The receiver 110 may compensate signal distortion of the amplified input signal IN in response to a control signal MR<0:n> and a bias signal BIAS_EQ<0:n>. The input signal IN may be a data signal, but not limited thereto. The input signal IN may include a command signal, a clock signal, an address signal, and the like.

In an embodiment, the data reference voltage VREFDQ may be provided from a reference voltage generation circuit (not shown) that is arranged outside the receiver 110. In another embodiment, the data reference voltage VREFDQ may be generated by a reference voltage generation circuit arranged in the receiver 110.

The internal circuit 120 may operate in response to the output signal OUT.

In an embodiment, the control signal MR<0:n> may be a plural-bit digital signal. The control signal MR<0:n> may be a signal that is set in a mode register (not shown). The control signal MR<0:n> may be provided such that the signal provided to the receiver 110 as the control signal MR<0:n> varies according to a voltage level of the input signal IN.

The semiconductor apparatus 10 may use a reference voltage to receive an external signal. The reference voltage may be provided from the outside or may be generated inside the semiconductor apparatus.

The setting with respect to voltage levels of the reference voltage inside the semiconductor apparatus may be referred to as a reference voltage training. For the reference voltage training, the semiconductor apparatus may set the level of the reference voltage in response to a plural-bit training code, and perform the desired operation according to the set reference voltage. When the level of the reference voltage is set through the reference voltage training, the training code corresponding thereto may be stored in the mode register.

The receiver 110 may use the data reference voltage VREFDQ to receive the input signal IN. The receiver 110 may compensate signal distortion of the input signal IN based on the control signal MR<0:n> and the bias signal BIAS_EQ<0:n>, which are determined when the level of the data reference voltage VREFDQ is set.

The bias signal BIAS_EQ<0:n> may include a plurality of bias voltages.

The receiver 110 may generate an equalizer driving signal from the bias signal BIAS_EQ<0:n> in response to the control signal MR<0:n>, and compensate the distortion of the input signal IN in response to the generated equalizer driving signal.

A signal being transmitted through a channel may be attenuated due to the path loss of the channel. Such path loss typically attenuates high frequency components more than low frequency components. The high frequency components in a digital signal may correspond to a portion in which a voltage level of the signal is sharply changed such as a rising edge or a falling edge. Accordingly, the signal passing through the channel may have a distorted waveform. Further, an arrival time of the signal may vary according to the transmission frequency thereof, and thus jitter or inter symbol interference (ISI) may occur.

An equalizer circuit may be used to compensate the distortion of the input signal IN passing through the channel. The equalizer circuit may be a circuit that compensates the signal distortion occurring during the signal propagation in the channel by emphasizing or suppressing the signal according to a frequency band.

Even in a channel designed in the same manner, the loss may vary according to a fabrication condition and an operation condition of the semiconductor apparatus, and thus the distortion of the input signal IN may be compensated in different ways according to the loss difference. In an embodiment, at least one of the bias signals BIAS_EQ<0> to BIAS_EQ<n> may be selected in response to the control signal MR<0:n> determined according to the voltage level of the input signal IN, and the equalizer circuit may be driven by the bias signal selected between the bias signals BIAS_EQ<0> to BIAS_EQ<n>. That is, the equalizer circuit may be driven by the bias voltage selected depending on the voltage level of the input signal IN, and thus the signal distortion of the input signal IN may be accurately compensated.

A detailed operation of the equalizer circuit will be described later.

Figure 2:
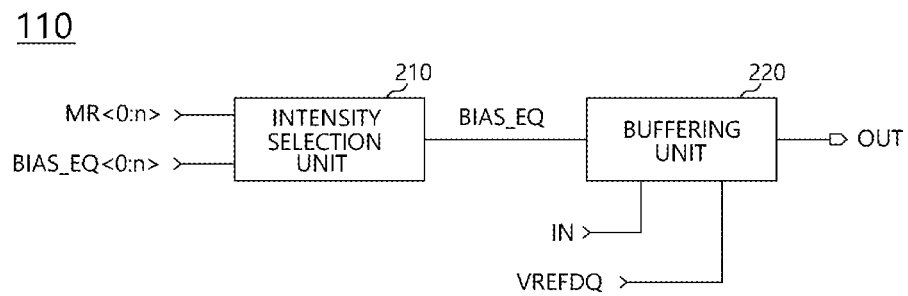
FIG. 2 is a configuration diagram illustrating a receiver according to an embodiment of the inventive concept.

FIG. 2 is a configuration diagram illustrating a receiver according to an embodiment.

Referring to FIG. 2, the receiver 110 according to an embodiment may include an intensity selection unit 210 and a buffering unit 220.

The intensity selection unit 210 may generate an equalizer driving signal BIAS_EQ in response to the control signal MR<0:n> and the bias signal BIAS_EQ<0:n>.

The buffering unit 220 may receive the input signal IN, determine a voltage level of the input signal IN based on the data reference voltage VREFDQ, and generate the output signal OUT by amplifying the input signal IN. The buffering unit 220 may compensate the distortion of the amplified input signal IN in response to the equalizer driving signal BIAS_EQ.

As described above, the control signal MR<0:n> may be a plural-bit digital code that is set based on the voltage level of the input signal IN. The bias signal BIAS_EQ<0:n> may include a plurality of bias voltages.

When the equalizer driving signal BIAS_EQ is generated by at least one of the bias signals BIAS_EQ<0> to BIAS_EQ<n> based on the control signal MR<0:n>, the buffering unit 220 may compensate the distortion of the input signal IN.

Figure 3:
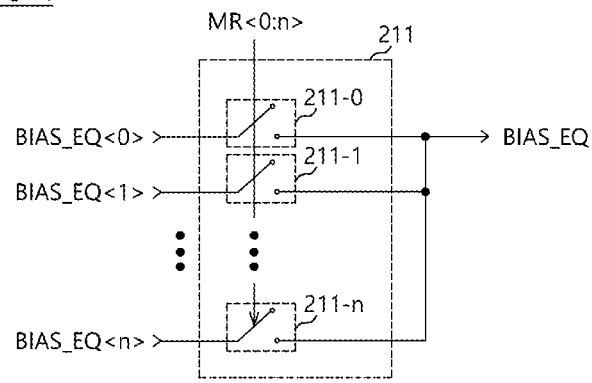
FIG. 3 is a configuration diagram illustrating an intensity selection unit according to an embodiment of the inventive concept.

FIG. 3 is a configuration diagram illustrating an intensity selection unit according to an embodiment.

Referring to FIG. 3, an intensity selection unit 210-1 according to an embodiment may include a selection circuit 211.

The selection circuit 211 may include a plurality of switching circuits 211-0 to 211-n. Each of the switching circuits 211-0 to 211-n may be turned on in response to digital codes constituting the control signal MR<0:n>.

The bias signals BIAS_EQ<0> to BIAS_EQ<n> may be applied to input terminals of the switching circuits 211-0 to 211-n, and output terminals of the switching circuits 211-0 to 211-n may be coupled in common to an output terminal of the equalizer driving signal BIAS_EQ.

Accordingly, the voltage level of the equalizer driving signal BIAS_EQ may be determined by one or more of the switching circuits 211-0 to 211-n, which are turned on in response to the control signal MR<0:n>.

Figure 4:
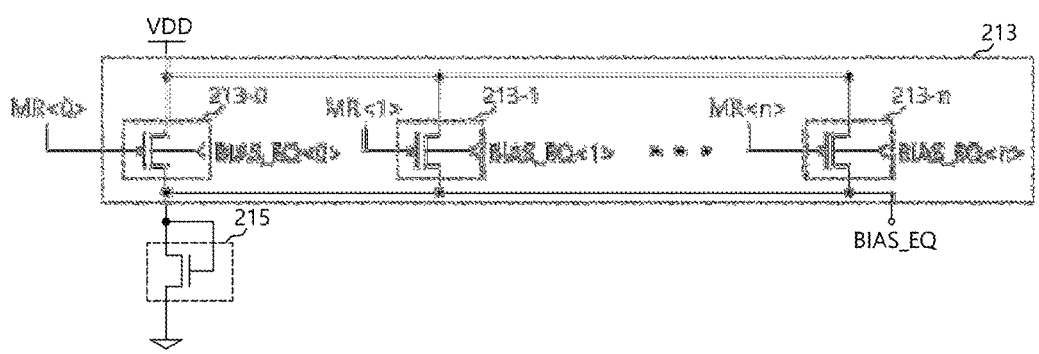
FIG. 4 is a configuration diagram illustrating an intensity selection unit according to an embodiment of the inventive concept.

FIG. 4 is a configuration diagram illustrating an intensity selection unit according to an embodiment.

An intensity selection unit 210-2 illustrated in FIG. 4 may include a selection circuit 213 and an output unit 215.

The selection circuit 213 may include a plurality of switching circuits 213-0 to 213-n that operate in response to digital codes MR<0> to MR<n> constituting the control signal MR<0:n>.

The switching circuits 213-0 to 213-n may be coupled in parallel between a supply terminal of a power voltage VDD and an output terminal of the equalizer driving signal BIAS_EQ, and receive the bias signals BIAS_EQ<0> to BIAS_EQ<n> as bulk voltages.

The output unit 215 may include a diode-connected transistor coupled between the output terminal of the equalizer driving signal BIAS_EQ and a ground terminal.

The control signal MR<0:n>, which is a plural-bit digital signal corresponding to the voltage level of the input signal IN, may allow at least one of the switching circuits 213-0 to 213-n may be turned on. The voltage level at the drain of the output unit 215 may be determined based on the control signal MR<0:n> and the bias signals BIAS_EQ<0> to BIAS_EQ<n>. Accordingly, the voltage level of the equalizer driving signal BIAS_EQ may be determined according to the control signal MR<0:n> and the bias signal BIAS_EQ<0:n>.

Figure 5:
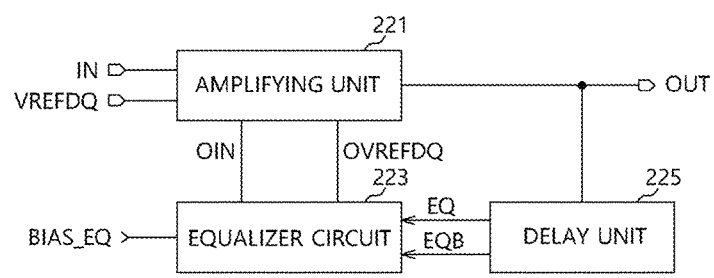
FIG. 5 is a configuration diagram illustrating a buffering unit according to an embodiment of the inventive concept.

FIG. 5 is a configuration diagram illustrating a buffering unit according to an embodiment.

The buffering unit 220 according to an embodiment may include an amplifying unit 221, an equalizer circuit 223, and a delay unit 225.

The amplifying unit 221 may receive the input signal IN, determine the voltage level of the input signal IN based on the data reference voltage VREFDQ, and generate the output signal OUT by amplifying the input signal IN.

The equalizer circuit 223 may operate in response to feedback signals EQ and EQB, and compensate the distortion of the input signal IN in response to the equalizer driving signal BIAS_EQ.

The delay unit 225 may generate a pair of feedback signals EQ and EQB having opposite phases by delaying the output signal OUT.

In an embodiment, the amplifying unit 221 may a single-stage amplifier or a multi-stage amplifier. The output signal OUT may be a differential signal or a single signal.

In an embodiment, the delay unit 225 may include a plurality of inverters coupled in series.

The equalizer circuit 223 may be driven according to the feedback signals EQ and EQB generated from the output signal OUT, and compensate the distortion of the amplified input signal IN. For instance, the equalizer circuit 223 may compensate the attenuation of a high frequency component in a rising edge portion or a falling edge portion of the input signal IN.

Figure 6:
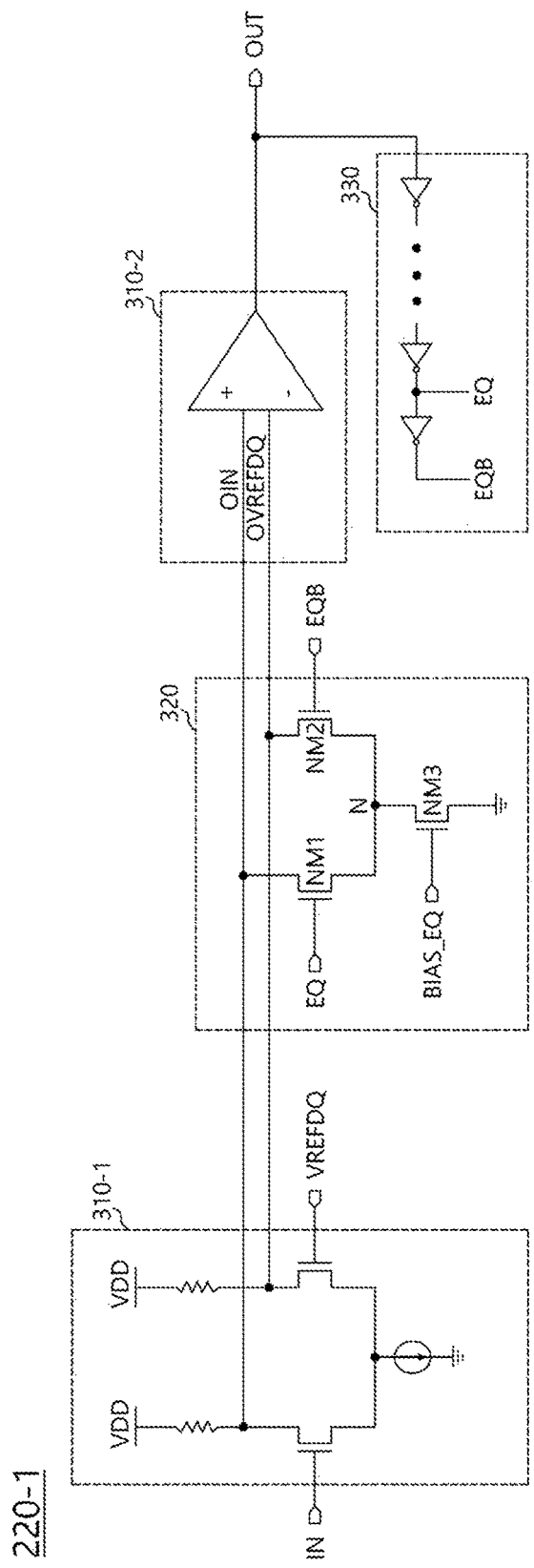
FIG. 6 is a circuit diagram illustrating a buffering unit according to an embodiment of the inventive concept.

FIG. 6 is a circuit diagram illustrating a buffering unit according to an embodiment.

A buffering unit 220-1 illustrated in FIG. 6 may include a first amplifying unit 310-1, a second amplifying unit 310-2, an equalizer circuit 320, and a delay unit 330.

The first amplifying unit 310-1 may receive the input signal IN and the data reference voltage VREFDQ, and output first and second differential amplification signals OIN and OVREFDQ by differentially amplifying the input signal IN and the data reference voltage VREFDQ.

The second amplifying unit 310-2 may receive the first and second differential amplification signals OIN and OVREFDQ, and generate the output signal OUT by differentially amplifying the first and second differential amplification signals OIN and OVREFDQ.

The equalizer circuit 320 may equalize the amplified input signal OIN in response to the feedback signals EQ and EQB and the equalizer driving signal BIAS_EQ, which means that an adjustment of a high frequency component and a low frequency component of the amplified input signal OIN may be carried out in response to the feedback signals EQ and EQB and the equalizer driving signal BIAS_EQ. For example, equalizer circuit 320 may equalize the amplified input signal OIN by increasing the high frequency component of the amplified input signal OIN generated from the distorted input signal IN or attenuating the low frequency component of the amplified input signal OIN.

The delay unit 330 may generate a first feedback signal EQ and a second feedback signal EQB by delaying the output signal OUT for a preset time. In an embodiment, the first feedback signal EQ may be a signal having the same phase as the output signal OUT, and the second feedback signal EQB may be a signal having an opposite phase to the output signal OUT. However, the first feedback signal EQ and the second feedback signal EQB are not limited thereto.

As shown in FIG. 6, the equalizer circuit 320 may be driven by the equalizer driving signal BIAS_EQ determined based on the voltage level of the input signal IN. Accordingly, the buffering unit 220-1 may accurately detect the voltage level of the input signal IN by accurately compensating the distortion of the input signal IN, and generate the output signal OUT by amplifying the input signal. The equalizer circuit 320 may include a first MOS transistor NM1, a second MOS transistor NM2 and a third MOS transistor NM3. The first MOS transistor NM1 includes a gate receiving the first feedback signal EQ, a drain receiving the first differential amplification signals OIN and a source connecting with a node N. Thus, the first MOS transistor NM1 is configured to transmit the first differential amplification signal OIN to the node N in response to the first feedback signal EQ. The second MOS transistor NM2 includes a gate receiving the second feedback signal EQB including an opposite level to the first feedback signal EQ, a drain receiving the second differential amplification signals OVREFDQ and a source connecting with the node N. Thus, the second MOS transistor NM2 is configured to transmit the second differential amplification signal OVREFDQ to the node N in response to the second feedback signal EQB. The third MOS transistor NM3 includes a gate receiving the equalizer driving signal BIAS EQ, a drain connected to the node N and a source connected to a ground terminal. The third MOS transistor NM3 is configured to sink a current of the node N to the ground terminal in response to the equalizer driving signal BIAS EQ.

Figure 7:
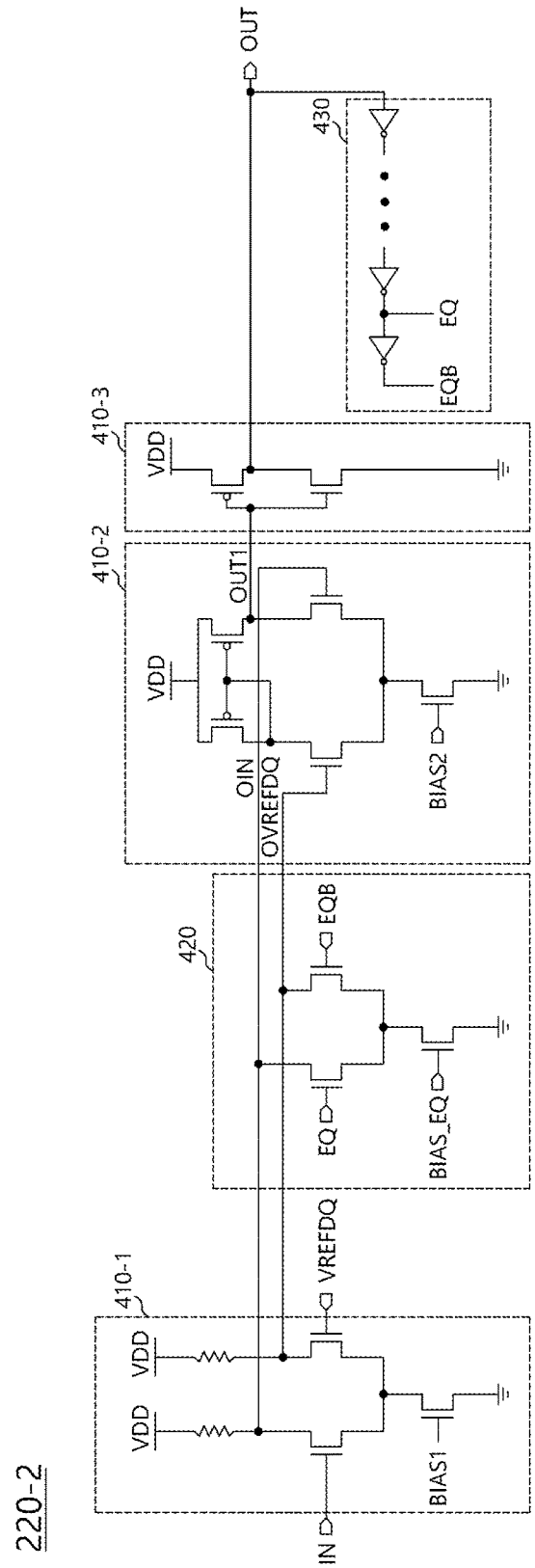
FIG. 7 is a circuit diagram illustrating a buffering unit according to an embodiment of the inventive concept.

FIG. 7 is a circuit diagram illustrating a buffering unit according to an embodiment.

A buffering unit 220-2 according to an embodiment may include a first amplifying unit 410-1, a second amplifying unit 410-2, a third amplifying unit 410-3, an equalizer circuit 420, and a delay unit 430.

The first amplifying unit 410-1 may receive the input signal IN and the data reference voltage VREFDQ, and output the first and second differential amplification signals OIN and OVREFDQ by differentially amplifying the input signal IN and the data reference voltage VREFDQ.

The second amplifying unit 410-2 may receive the first and second differential amplification signals OIN and OVREFDQ, and generate a preliminary output signal OUT1 by differentially amplifying the first and second differential amplification signals OIN and OVREFDQ.

The third amplifying unit 410-3 may generate the output signal OUT by amplifying the preliminary output signal OUT1.

The equalizer circuit 420 may equalize the amplified input signal OIN in response to the feedback signals EQ and EQB and the equalizer driving signal BIAS_EQ.

The delay unit 430 may generate the first feedback signal EQ and the second feedback signal EQB by delaying the output signal OUT for a preset time.

In an embodiment, the equalizer circuit 420 may be driven by the equalizer driving signal BIAS_EQ determined based on the voltage level of the input signal IN. Accordingly, the buffering unit 220-2 may accurately detect voltage the level of the input signal IN by compensating the distortion of the input signal IN, and generate the output signal OUT by amplifying the input signal.

Figure 8:
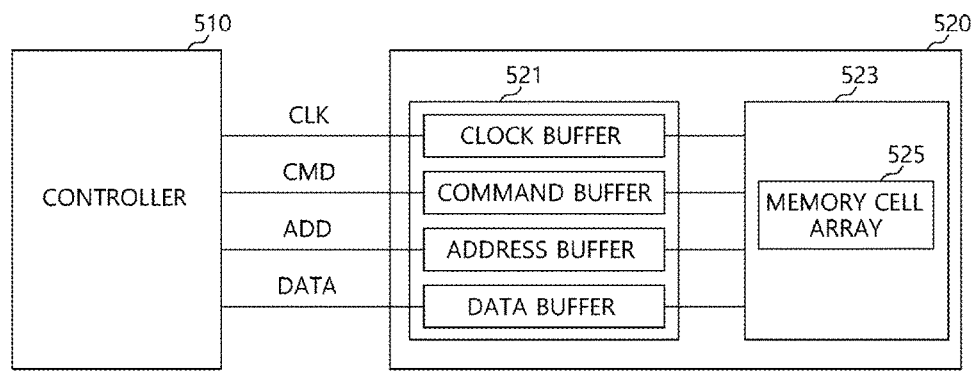
FIG. 8 is a configuration diagram illustrating a semiconductor memory apparatus according to an embodiment of the inventive concept.

FIG. 8 is a configuration diagram illustrating a semiconductor memory apparatus according to an embodiment.

A semiconductor memory apparatus 50 according to the embodiment may include a controller 510 and a memory device 520.

The memory device 520 may include a receiver 521 and a memory core 523. The memory core 523 may include a memory cell array 525. The memory device 520 may be a volatile memory device such as a dynamic random access memory (DRAM) or a nonvolatile memory device such as a flash memory or a resistive memory, but the memory device 520 is not limited thereto.

Although not shown in FIG. 8, the memory core 523 may include components that read out data from the memory cell array 525 and write data to the memory cell array 525. For example, the memory core 523 may include an address decoder, a write circuit unit, a read-out circuit unit, and the like.

The memory device 520 may receive a clock signal CLK, a command CMD, an address ADD, data DATA, and the like from the controller 510. The memory device 520 may store data DATA provided from the controller 510 in the memory cell array 525 or transmit data DATA stored in the memory cell array 525 to the controller 510 according to a request of the controller 510.

The receiver 521 may include a clock buffer, which converts the clock signal CLK provided from the controller 510 into an internal clock signal, a command buffer, which converts the command CMD provided from the controller 510 into an internal command, an address buffer, which converts the address ADD provided from the controller 510 into an internal address, and a data buffer, which converts the data DATA provided from the controller 510 into internal data.

Components that receive signals such as the clock buffer, the command buffer, the address buffer, the data buffer, and the like may include, among other things, the receiver 110 described in FIGS. 1 to 7.

The receiver 521 in the clock buffer, the command buffer, the address buffer, or the data buffer may output the input signal IN, CLK, CMD, ADD, or DATA by amplifying the input signal IN, CLK, CMD, ADD, or DATA. The clock buffer, the command buffer, the address buffer, or the data buffer in accordance with an embodiment may compensate the distortion of the input signal IN, CLK, CMD, ADD, or DATA in response to the equalizer driving signal BIAS_EQ, which is set based on the control signal MR<0:n> determined according to the voltage level of the input signal IN, CLK, CMD, ADD, or DATA, and provide the distortion-compensated input signal IN, CLK, CMD, ADD, and DATA to an internal circuit such as an address decoder, a write circuit unit, a read-out circuit unit, and the like, which may be included in the memory core 523.

Although not shown in FIG. 8, the control signal MR<0:n> and the bias signal BIAS_EQ<0:n> may be provided to the receiver 521 from the controller 510.

Figure 9:
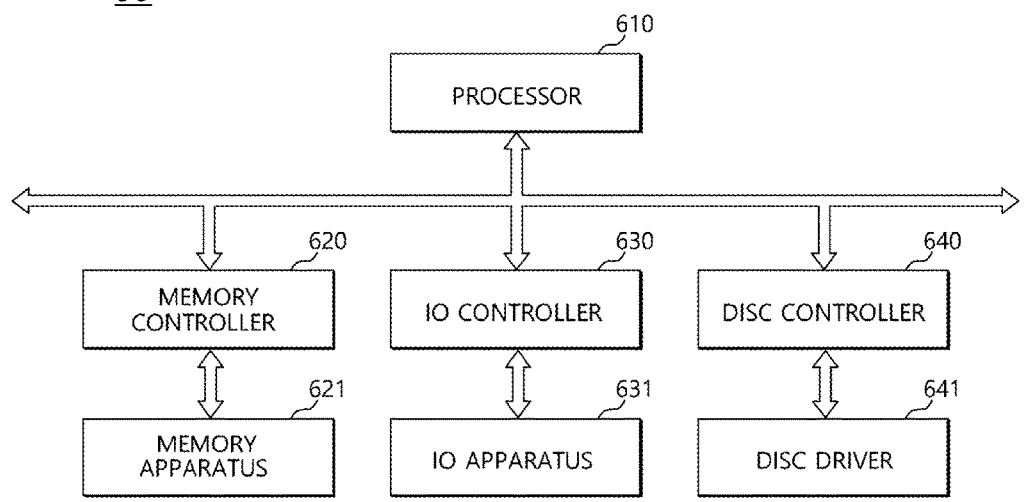
FIG. 9 is a configuration diagram illustrating an electronic system according to an embodiment of the inventive concept.

FIG. 9 is a configuration diagram illustrating an electronic system according to an embodiment.

An electronic system 60 according to an embodiment may include a processor 610, a memory controller 620, a memory apparatus 621, an input/output (IO) controller 630, an IO apparatus 631, a disc controller 640, and a disc driver 641.

At least one processor 610 may be provided, and the processor 410 may operate independently from other processors or may operate in conjunction with the other processors. The processor 610 may communicate with other components such as the memory controller 620, the IO controller 630, and the disc controller 640 through a bus (e.g., control bus, address bus, and data bus).

The memory controller 620 may be coupled to at least one memory apparatus 621. The memory controller 620 may receive a request provided from the processor 610, and control the at least one memory apparatus 621 based on the request.

The memory apparatus 621 may include the receiver 110 described with reference to FIGS. 1 to 7.

The IO controller 630 may be coupled between the processor 610 and the IO apparatus 631 and may transfer an input from the IO apparatus 631 to the processor 610 or provide a processing result of the processor 610 to the IO apparatus 631. The IO apparatus 631 may include an input device such as a keyboard, a mouse, a touch screen, or a microphone, and an output device such as a display or a speaker.

The disc controller 640 may control at least one disc driver 641 in response to control signals provided from the processor 610.

In the electronic system 60, when an external signal is input to the memory apparatus 621 under control of the processor 610, the receiver 110 provided in the memory apparatus 621 may amplify an input signal IN as the external signal and output the amplified input signal IN. That is, the receiver 110 may compensate the distortion of the input signal IN in response to the equalizer driving signal BIAS_EQ, which is set based on the control signal MR<0:n> determined according to the voltage level of the input signal IN, and provide the distortion-compensated input signal to an internal circuit such as an address decoder, a write circuit unit, a read-out circuit unit, and the like, which may be included in the memory apparatus 621.

The receiver in accordance with an embodiment may have the same configuration as the receiver 110 described in FIGS. 1 to 7, but not limited thereto.

The above embodiment is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor apparatus comprising:
   a receiver configured to generate an output signal by amplifying an input signal received through a channel, and compensate distortion of the input signal based on a control signal preset according to a voltage level of the input signal; and
   an internal circuit configured to operate in response to the output signal,
   wherein the receiver is configured to determine a level of an equalizer driving signal by selecting at least one of a plurality of bias voltages based on the control signal, and
   wherein the receiver includes:
   an amplifying unit configured to generate the output signal by detecting and amplifying a difference between the input signal and a reference voltage;

a delay unit configured to delay the output signal of the amplifying unit and generate a feedback signal; and an equalizer circuit configured to control a current sink amount in response to the equalizer driving signal when the feedback signal is input, thereby equalizing the input signal with the reference voltage, and wherein the equalizer driving signal is generated based on the control signal and the plurality of bias voltages.

2. The semiconductor apparatus of claim 1, wherein the receiver is configured to adjust one or both of a high frequency component or a low frequency component of the input signal in response to the equalizer driving signal determined based on the control signal and the feedback signal generated from the output signal.

3. The semiconductor apparatus of claim 1, wherein the receiver further includes:

an intensity selection unit configured to generate the equalizer driving signal based on the control signal and the plurality of bias voltages, wherein the amplifying unit, the delay unit and the equalizer circuit constitute a buffering unit.

4. The semiconductor apparatus of claim 1, wherein the reference voltage is set according to the control signal.

5. The semiconductor apparatus of claim 1, wherein the control signal includes a plural-bit digital code.

6. The semiconductor apparatus of claim 1, wherein the control signal is preset in a mode register.

7. The semiconductor apparatus of claim 1, wherein the amplifying unit includes:

a first amplifying unit configured to receive the input signal and the reference voltage and output first and second differential amplification signals; and a second amplifying unit configured to receive and amplify the first and second differential amplification signals and generate the output signal.

8. The semiconductor apparatus of claim 1, wherein the equalizer circuit includes:

a first MOS transistor for transmitting the first differential amplification signal to a node in response to a first feedback signal;

a second MOS transistor for transmitting the second differential amplification signal to the node in response to a second feedback signal including an opposite level to the first feedback signal; and a third MOS transistor for sinking a current of the node to a ground terminal in response to the equalizer driving signal.

9. A receiver comprising:

an intensity selection unit configured to determine a level of an equalizer driving signal by selecting at least one of a plurality of bias voltages based on a control signal preset according to a voltage level of an input signal; and a buffering unit configured to generate an output signal by amplifying an input signal received through a channel, and compensate distortion of the input signal based on the equalizer driving signal, wherein the intensity selection unit generates the equalizer driving signal based on the control signal and a preset bias signal, and wherein the buffering unit includes:

an amplifying unit configured to generate the output signal by detecting and amplifying a difference between the input signal and a reference voltage;

a delay unit configured to delay the output signal and generate a feedback signal from the output signal; and an equalizer circuit configured to equalize the input signal with the reference voltage in response to the equalizer driving signal reflecting the voltage level of the input signal when the feedback signal is input.

10. The receiver of claim 9, wherein the equalizer circuit is configured to compensate the distortion of the input signal in response to the equalizer driving signal.

11. The receiver of claim 9, wherein the buffering unit adjusts a high frequency component or a low frequency component of the input signal in response to the equalizer driving signal and a feedback signal generated from the output signal.

12. The receiver of claim 9, wherein the reference voltage is set according to the control signal.

13. The receiver of claim 9, wherein the control signal includes a plural-bit digital code.

14. The receiver of claim 9, wherein the control signal is preset in a mode register.

15. The receiver of claim 9, wherein the amplifying unit includes:

a first amplifying unit configured to receive the input signal and the reference voltage and output first and second differential amplification signals; and a second amplifying unit configured to receive and amplify the first and second differential amplification signals and generate the output signal.

16. The receiver of claim 9, wherein the equalizer circuit includes:

a first MOS transistor for transmitting the first differential amplification signal to a node in response to a first feedback signal;

a second MOS transistor for transmitting the second differential amplification signal to the node in response to a second feedback signal including an opposite level to the first feedback signal; and a third MOS transistor for sinking a current of the node to a ground terminal in response to the equalizer driving signal.

* * * * *